(12) United States Patent
Dixon et al.

(10) Patent No.: US 7,742,357 B2
(45) Date of Patent: *Jun. 22, 2010

(54) SECURING AN INTEGRATED CIRCUIT

(75) Inventors: Robert C. Dixon, Austin, TX (US);
Kirk E. Morrow, Round Rock, TX (US); Phil C. F. Paone, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1083 days.

This patent is subject to a terminal disclaimer.

(21) Appl. No.: 11/381,824

(22) Filed: May 5, 2006

(65) Prior Publication Data

US 2007/0258280 A1 Nov. 8, 2007

(51) Int. Cl.
*G11C 17/18* (2006.01)
(52) U.S. Cl. ............................. 365/225.7; 365/185.04; 365/201; 365/96

(58) Field of Classification Search .............. 365/225.7, 365/185.04, 201, 207, 96
See application file for complete search history.

(56) References Cited

U.S. PATENT DOCUMENTS

| | | | | |
|---|---|---|---|---|
| 6,549,063 | B1 * | 4/2003 | Lehmann et al. | 327/525 |
| 7,019,534 | B2 * | 3/2006 | Wu | 324/550 |
| 7,224,633 | B1 * | 5/2007 | Hovis et al. | 365/225.7 |
| 7,321,522 | B2 * | 1/2008 | Dixon et al. | 365/225.7 |

* cited by examiner

*Primary Examiner*—Tuan T Nguyen
*Assistant Examiner*—Toan Le
(74) *Attorney, Agent, or Firm*—Biggers & Ohanian, LLP

(57) ABSTRACT

Securing an integrated circuit, including fabricating the integrated circuit to include a multiplicity of unblown efuses, at least one surrogate efuse that emulates a blown efuse, non-volatile data representing the blown state of the surrogate efuse, and security circuitry; and setting, by the security circuitry when power is first applied to the integrated circuit, a security state of the integrated circuit in dependence upon whether a sensed state of the surrogate efuse is equal to the blown state of the surrogate efuse.

14 Claims, 5 Drawing Sheets

SECURING AN INTEGRATED CIRCUIT

BACKGROUND OF THE INVENTION

1. Field of the Invention

The field of the invention is data processing, or, more specifically, methods and apparatus for securing an integrated circuit.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One area of computer technology that has seen rapid advancement is the use of electronic fuses ('efuses') to manufacture integrated circuits that can reconfigure themselves automatically. An efuse is an element of an integrated circuit designed to undergo electromigration when exposed to a certain level of programming voltage and change the resistance of the circuit element from a low resistance to a high resistance, allowing a sensing circuit to sense the element as 'on,' 'programmed,' or 'blown.' During the life cycle of an integrated circuit, unblown efuses may be blown to configure and control access to scan circuitry and operational logic of an integrated circuit, for example. Efuses are used to configure integrated circuits after the silicon masking and fabrication process. Efuses may be used to configure customizable circuits or to correct silicon manufacturing defects and increase manufacturing yield.

Efuses can also be used to create test modes for an entire integrated circuit that customize the testability of an integrated circuit as it goes through the various stages of manufacturing. For some applications such as microprocessors it may be desirable to have various modes of operations. These modes may include various secure and non-secure states. By controlling clocks and mux selects, entire portions of an integrated circuit can be turned on and off depending on the integrated circuit's security state. After bring-up and testing is complete, secure information would only be readable during the normal operation of the integrated circuit and is unreadable to the outside world. More importantly the state of the outputs of a secure memory could not be scanned by an attacker or hacker who has forced the integrated circuit into test mode.

It may be possible for a hacker to attempting to defeat a security mechanism implemented by the efuses to alter the operating environment in such a way that the circuitry that senses efuses values does not operate correctly. Such environmental changes will usually affect most or all of the efuses on a given integrated circuit and would cause efuses that have actually been blown to appear to be unblown. If successful, the attacker would then have the same access to the integrated circuit is if the integrated circuit just came out of fabrication and all fuses are not blown.

Due to the fact that an integrated circuit is initially fabricated in a non-secure state it is general practice to equate an efuse's unblown state with a non-secure system state. In order to prevent environmental changes that make all efuses to appear unblown from unlocking a secured integrated circuit, it could instead be considered an invalid state. One or more efuses that should be always blown for all circumstances can then be used to set the integrated circuit in an invalid mode and block access if sensed as unblown. The difficulty with this is that all efuses are unblown at the end of fabrication and the integrated circuit would be locked before any fuses can be blown. One currently used way around this is through the use of a wafer-only pin ('WOP'). During wafer testing, a WOP is accessible that can be driven high to the same logic that detects the always blown efuse(s) causing the always blown efuse(s) to appear to be blown. This allows access to the integrated circuit to burn the always burned efuse(s). When the integrated circuit die is packaged, this WOP is tied low and not brought out from the die to a package pin.

There are substantial disadvantages to the use of a WOP, however. In integrated circuit design, adding any circuit element adds expense, especially a circuit element that requires a conductive pathway to a circuit pad and an outside connection. In addition, test drive patterns must be made more complex and therefore more expensive in order to drive the additional enabling signals through the WOP.

SUMMARY OF THE INVENTION

Methods and apparatus are disclosed for securing an integrated circuit that include fabricating the integrated circuit to include a multiplicity of unblown efuses, at least one surrogate efuse that emulates a blown efuse, non-volatile data representing the blown state of the surrogate efuse, and security circuitry; and setting, by the security circuitry when power is first applied to the integrated circuit, a security state of the integrated circuit in dependence upon whether a sensed state of the surrogate efuse is equal to the blown state of the surrogate efuse.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
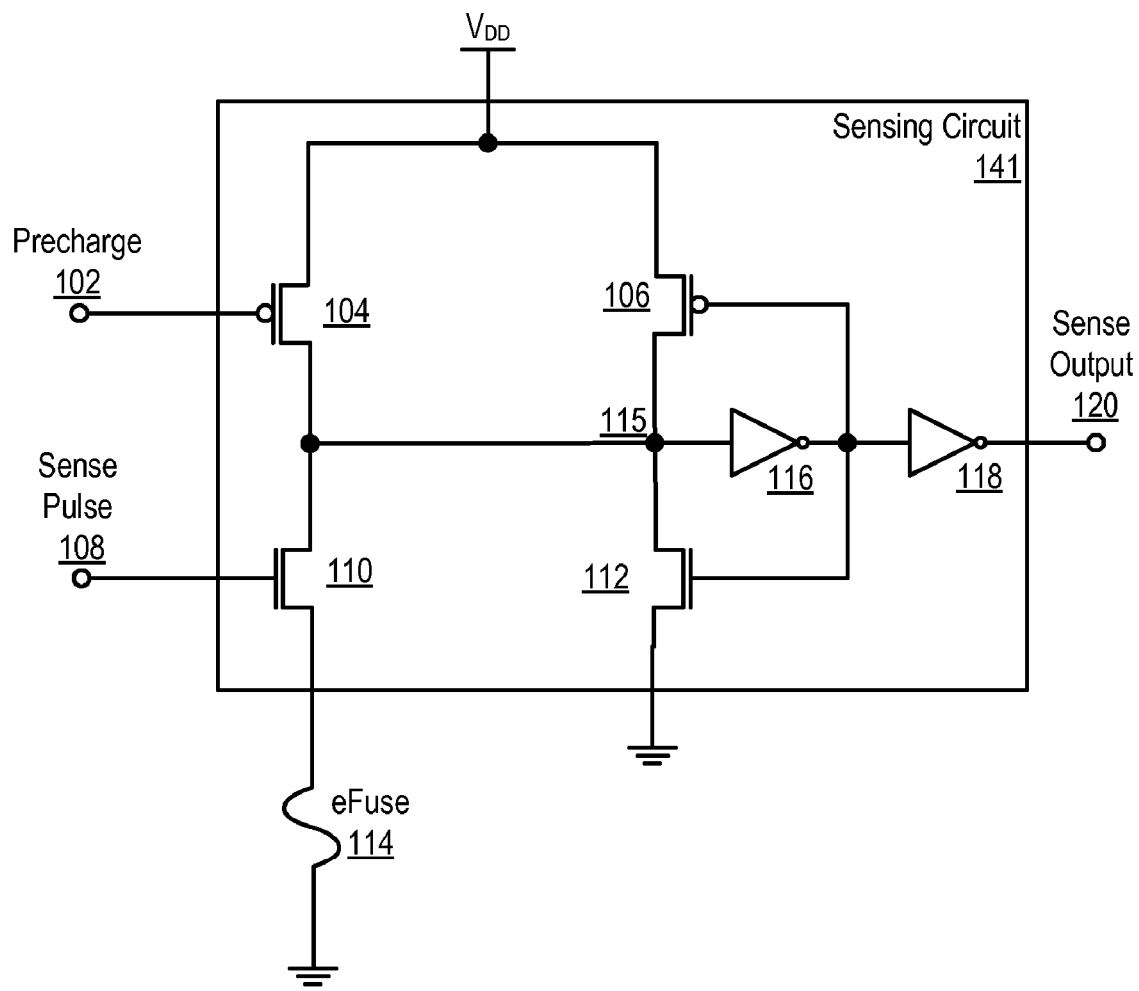
FIG. 1 sets forth a line drawing illustrating an example of a sensing circuit for sensing the state of an efuse in apparatus that secure integrated circuits according to embodiments of the present invention.

Exemplary methods and apparatus for securing an integrated circuit according to embodiments of the present invention are described with reference to the accompanying drawings, beginning with FIG. 1. FIG. 1 sets forth a line drawing illustrating an example of a sensing circuit (141) for sensing the state of an efuse in apparatus that secure integrated circuits according to embodiments of the present invention.

Electromigration fuses or 'efuses' do not create a complete open in the circuit like a conventional fuse, but rather create a higher resistance connection. The actual resistance values of the efuses are technology dependant. However, a blown efuse element may typically have a resistance 15× or more greater than that of an unblown efuse. The sensing circuit that detects the efuse value as blown or unblown is timed to detect the efuse state appropriately.

In the example of FIG. 1, in an initial state of the sensing circuit, precharge input (102) is deasserted or set to 1, and sense pulse input (108) is also deasserted or set to 0. When a sense operation is to occur, security circuitry or a state machine of the security circuitry first asserts precharge input (102) by setting it to 0. This turns on the connected PMOS transistor (104) which forces the input to inverter (116) high. This will cause the output of inverter (116) to be 0 at which point the input (115) to inverter (116) is now also pulled high through the second PMOS transistor (106).

Then the security circuitry or state machine will apply a sense pulse to the sense pulse input (108), first asserting the sense pulse input by setting it to 1 while deasserting the precharge input by setting it back to 1, then some pulse duration later, deasserting the sense input by setting it back to 0. When the security circuitry or state machine asserts the sense pulse input (108) by setting it to 1 and deasserts the precharge input (102) by setting it back to 1, this turns on the efuse sense NMOS transistor (110) and shuts off the precharge PMOS transistor (104). The input (115) to inverter (116), which has been precharged, now sees a connection to ground through the efuse (114).

If the resistance of the efuse is small, because the efuse is unblown, the efuse will pull enough current during the sense pulse to drop the voltage on the input (115) of inverter (116) down to 0, and the output of inverter (116) goes to 1. At that point, the feedback transistors (106, 112) will change state, so that the NMOS transistor (112) is on and the PMOS transistor (106) is off maintaining a connection to ground. At this point the efuse has been sensed as unblown and the sense output (120) will be 0. For blown efuses, the resistance across the efuse is sufficient to prevent input (115) to inverter (116) from dropping past the switch point of the feedback devices during the sense pulse, and when the sense pulse input (108) deasserts, the sense circuit will maintain state with the value of the sense output (120) being 1.

Figure 2:
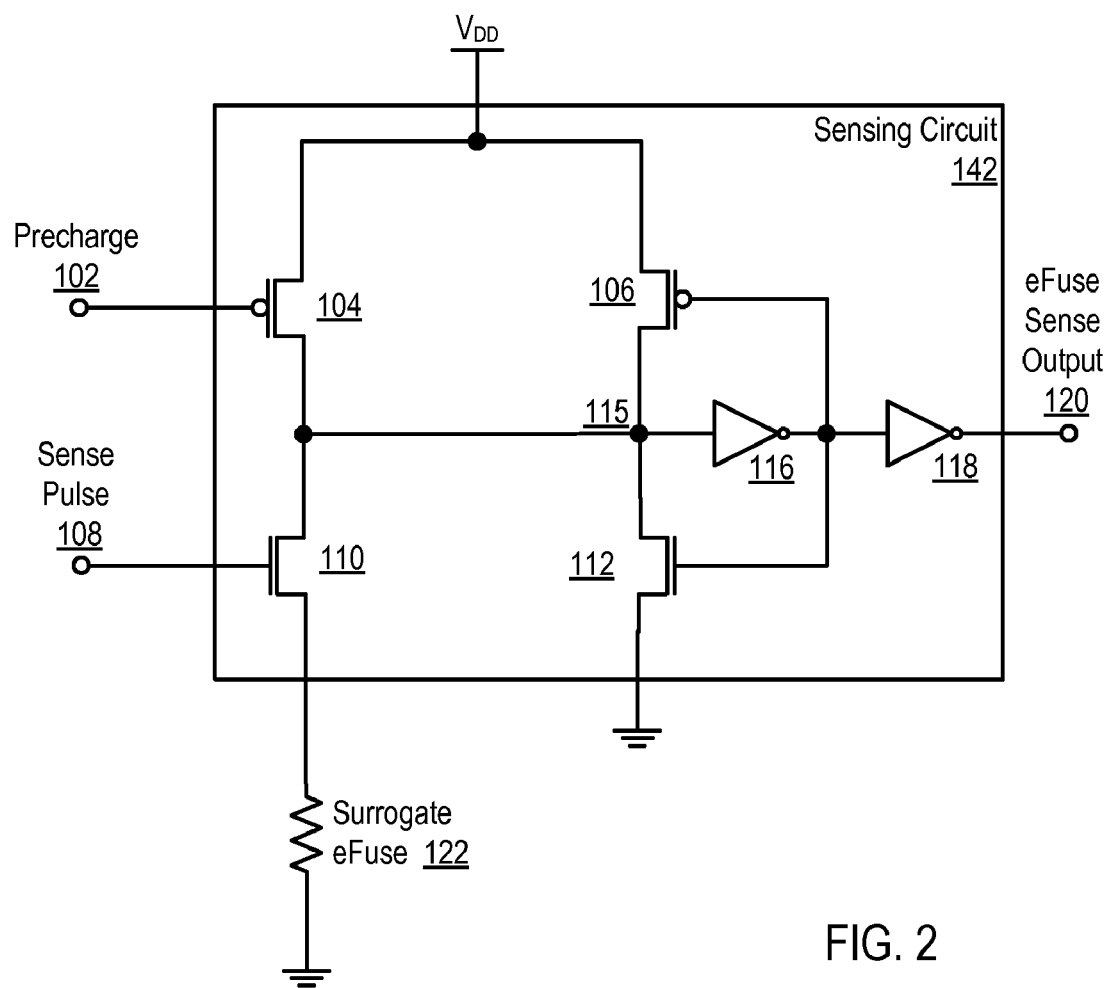
FIG. 2 sets forth a line drawing illustrating an example of a sensing circuit for sensing the state of a surrogate efuse in apparatus that secure integrated circuits according to embodiments of the present invention.

For further explanation, FIG. 2 sets forth a line drawing illustrating an example of a sensing circuit for sensing the state of a surrogate efuse in apparatus that secure integrated circuits according to embodiments of the present invention. In FIG. 2, the same basic sensing circuit (142) as from FIG. 1 is shown with a surrogate efuse (122) in place of an actual efuse. The surrogate efuse emulates an actual efuse that is always blown in normal operations.

The example sensing circuit (142) of FIG. 2 operates to sense the state of the surrogate efuse (122). In the example of FIG. 2, the surrogate efuse (122) is implemented as a resistor of an integrated circuit, where the resistor has a resistance high enough to emulate a blown efuse, that is, a resistance that is sufficiently higher than that of an unblown efuse so that the resistance will be sensed as a blown efuse by sensing circuit (142) in normal operation of the sensing circuit. This does not mean that an attacker cannot underclock the sense pulse input (110) or otherwise alter the operating environment of the circuit and artificially cause the surrogate efuse to be falsely sensed as unblown.

The operation of the sensing circuit (142) against surrogate efuse (122) is similar to the operation of the sensing circuit of FIG. 1 with respect to the efuse (114) of FIG. 1. In the example of FIG. 2, in an initial state of the sensing circuit (142), precharge input (102) is deasserted or set to 1, and sense pulse input (108) is also deasserted or set to 0. When a sense operation is to occur, security circuitry or a state machine of the security circuitry first asserts precharge input (102) by setting it to 0.

This turns on the connected PMOS transistor (104) which forces the input to inverter (116) high. This will cause the output of inverter (116) to be 0 at which point the input (115) to inverter (116) is now also pulled high through the second PMOS transistor (106).

Then the security circuitry or state machine will apply a sense pulse to the sense pulse input (108), first asserting the sense pulse input by setting it to 1 while deasserting the precharge input by setting it back to 1, then some pulse duration later, deasserting the sense input by setting it back to 0. When the security circuitry or state machine asserts the sense pulse input (108) by setting it to 1 and deasserts the precharge input (102) by setting it back to 1, this turns on the efuse sense NMOS transistor (110) and shuts off the precharge PMOS transistor (104). The input (115) to inverter (116), which has been precharged, now sees a connection to ground through the surrogate efuse (122). Because surrogate efuse emulates a blown efuse, the resistance across the efuse is sufficient in normal operation to prevent input (115) to inverter (116) from dropping past the switch point of the feedback transistors (106, 112) during a sense pulse, and when the sense pulse input (108) deasserts, the sense circuit will maintain state with the value of the sense output (120) being 1.

If the sense pulse is artificially extended, or if other environmental conditions are artificially modified by an attacker, despite the high resistance of the surrogate efuse, the surrogate efuse may pull enough current during the sense pulse to drop the voltage on the input (115) of inverter (116) down to 0, and the output of inverter (116) will then go to 1. At that point, the feedback transistors (106, 112) will change state, so that the NMOS transistor (112) is on and the PMOS transistor (106) is off maintaining a connection to ground. At this point the surrogate efuse has been falsely sensed as unblown and the sense output (120) will be 0.

Use of a sensing circuit and surrogate efuse as illustrated in the example of FIG. 2 allows every integrated circuit that uses efuses to have circuit elements, surrogate efuses, that appear to the integrated circuit as efuses that are always blown under normal operating conditions, even on the very first power up of the integrated circuit, in fact, particularly whenever power is first applied to an integrated circuit. Surrogate efuses along with other real unblown efuses can now be used to detect any attempts to override the normal efuse sensing operations. The surrogate efuses allow detection of any manipulation for the operating environment of an integrated circuit, temperature or clock speed, for example, that may cause all efuses to sense all zeros, and unblown efuses allow detection of any artificial manipulation to cause sensing all ones.

With this apparatus all efuse burns can be delayed until later in testing including efuse burns which distinguish between secure and non-secure modes. Initially with all efuses unblown but the surrogate efuses read as blown, the security circuitry of an integrated circuit may be configured to set a security state of the integrated circuit to allow full test capability. Before parts are shipped further, to OEMs or to end users, security efuses can be blown to limit scan access to the integrated circuit. Because attacks that attempt to force security efuses to sense in an unblown state would also cause the always blown surrogate efuses to sense as unblown, the attack would be detected when power is first applied to the integrated circuit, and security circuitry of the integrated circuit can then halt further power up sequencing and remain in blocked mode.

The arrangement of transistors, inverters, and other circuit elements in the example sensing circuits of FIGS. 1 and 2 is for explanation, not for limitation. Other forms of sensing circuit may be used by security circuitry or state machines of an integrated circuit to read the state of an efuse or a surrogate efuse in apparatus that secure integrated circuits according to embodiments of the present invention, and all such forms of sensing circuit are well within the scope of the present invention.

Figure 3:
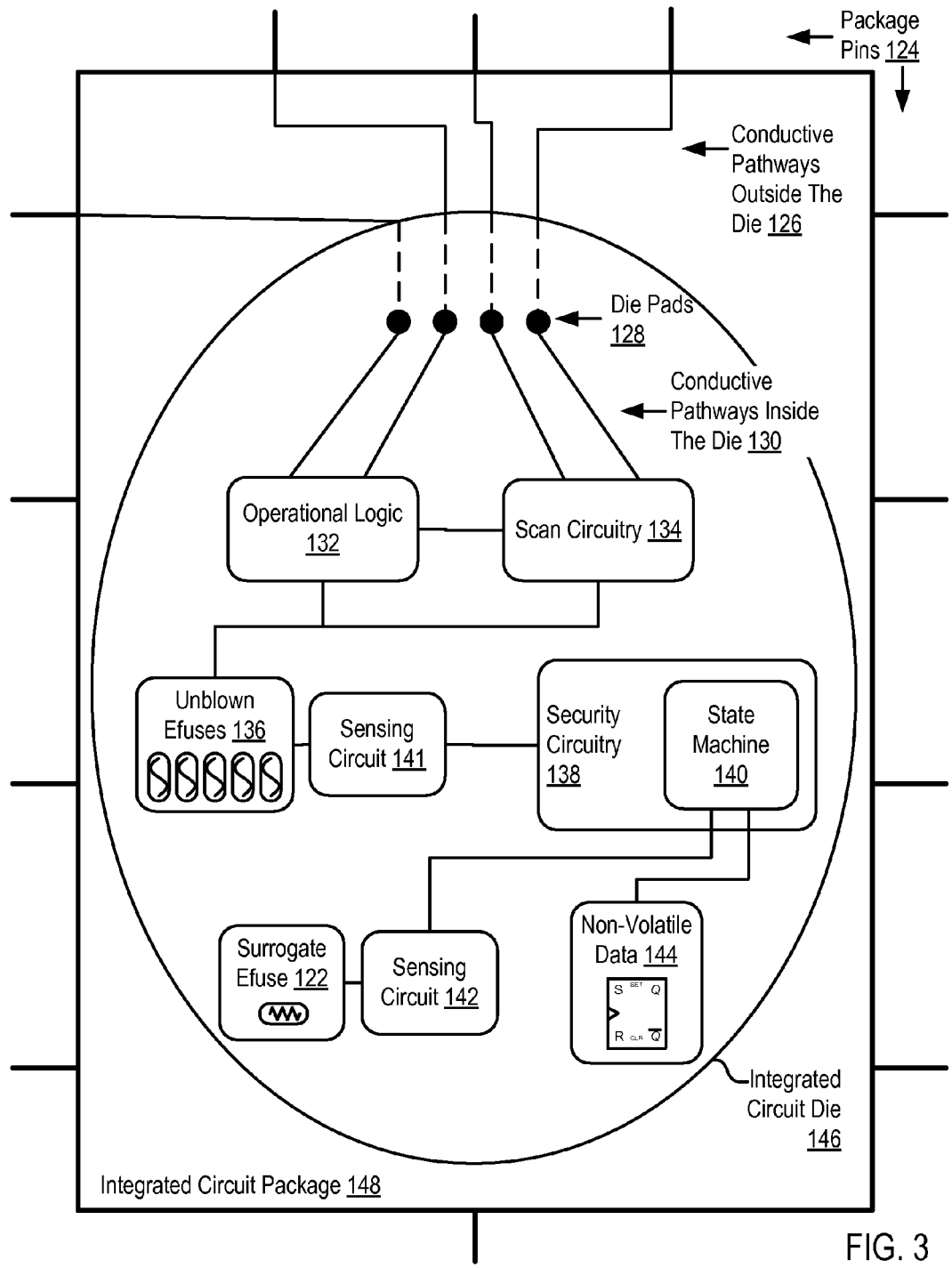
FIG. 3 sets forth a functional block diagram of an example integrated circuit that is secured according to embodiments of the present invention.

For further explanation, FIG. 3 sets forth a functional block diagram of an example integrated circuit that is secured according to embodiments of the present invention. The overall physical structure of the integrated circuit of FIG. 3 is implemented as an integrated circuit die (146) installed in an integrated circuit package (148). The integrated circuit of FIG. 3 includes conductive pathways (130) inside the die (146) connected through die pads (128) and conductive pathways (126) outside the die but inside the package (148) to package pins (124). The placement of the die in the package in the example of FIG. 3 is for explanation of the overall physical structure of an integrated circuit. An integrated circuit having the illustrated configuration is ready for shipment to an OEM or for installation in an electronic product. Readers will recognize, however, that the die is fabricated on a wafer with many other dice and sawed from the wafer during fabrication. The very first application of power to the integrated circuit typically occurs during fabrication test, before the die is packaged, and typically even before the die is sawn from the wafer.

The integrated circuit of FIG. 3 includes operational logic (132), the general functional circuitry of the integrated circuit, the circuitry that carries out the work that the integrated circuit is intended for, computer memory, computer processing, and so on, for example. The operational logic (132) typically is composed of many transistors and other circuit elements making up many inverters, gates, latches, registers, or memory storage elements. The details of operational logic often are confidential or proprietary, a subject of integrated circuit security, intended for protection against attack.

The integrated circuit of FIG. 3 also includes scan circuitry (134). Scan circuitry is a test element of the integrated circuit. Scan circuitry typically operates in a serial, first-in first-out, mode to initialize elements of an integrated circuit for test and to read values from circuit elements during test stages, to confirm proper operation of an integrated circuit. One examples of scan circuitry is boundary scan circuitry implemented according to the standards of the Joint Test Action Group ('JTAG'), although it is common for manufacturers of integrated circuits to implement sophisticated, proprietary scan circuitry also. Access to scan circuitry of an integrated circuit allows an attacker to learn details of the operational logic of the integrated circuit. Controlling access to scan circuitry therefore is both a subject of integrated circuit security and a tool of integrated circuit security.

The integrated circuit of FIG. 3 also includes a number of unblown efuses (136). As a practical matter, in an integrated circuit that uses efuses to configure and control access to scan circuitry and operational logic, there will be initially thousands of unblown efuses. During the life cycle of the integrated circuit, unblown efuses are blown to configure and control access to scan circuitry and operational logic. The integrated circuit of FIG. 3 also includes a sensing circuit (141) for sensing the state of efuses. Sensing circuit (141) is a circuit similar to the one illustrated and described above with regard to FIG. 1. For clarity of explanation, only one sensing circuit for efuses is shown in FIG. 3, although in actual practice, efuses are fabricated in cells with one sensing circuit for each efuse, so that when there are thousands of efuses in an integrated circuit, there are also thousands of sensing circuits.

The integrated circuit of FIG. 3 also includes at least one surrogate efuse (122). As a practical matter, in an integrated circuit that uses surrogate efuses to secure the integrated circuit according to embodiments of the present invention, there may be many surrogate efuses, depending on the application. The integrated circuit of FIG. 3 also includes a sensing circuit (142) for sensing the state of surrogate efuses. Sensing circuit (142) is a circuit similar to the one illustrated and described above with regard to FIG. 2. For clarity of explanation, only one sensing circuit for surrogate efuses is shown in FIG. 3, although in actual practice, surrogate efuses may be fabricated in cells with one sensing circuit for each surrogate efuse, so that when there is more than one surrogate efuses in an integrated circuit, there is also more than one sensing circuit for surrogate efuses.

The integrated circuit of FIG. 3 also includes non-volatile data (144) representing the blown state of the surrogate efuse. The surrogate efuse in this example emulates only one state of an efuse, the programmed or 'blown' state. An attacker may artificially cause the surrogate efuse to be sensed as unblown. Non-volatile data representing the blown state of the surrogate efuse is a bit of memory in which is permanently stored a value representing the blown state of the surrogate efuse. Non-volatile data representing the blown state of the surrogate efuse may be implemented for example by a latch with its output set to the 1 state and its inputs hardwired to voltage values that will always set its output to 1 when power is applied. An attacker may artificially cause the surrogate efuse to be sensed as unblown, but the non-volatile data representing the blown state of the surrogate efuse will always report the correct value of the surrogate efuse. Security circuitry of the integrated circuit therefore can always compare the value of the non-volatile data representing the blown state of the surrogate efuse with the sensed state of a surrogate efuse to determine whether the integrated circuit is under attack.

Figure 4:
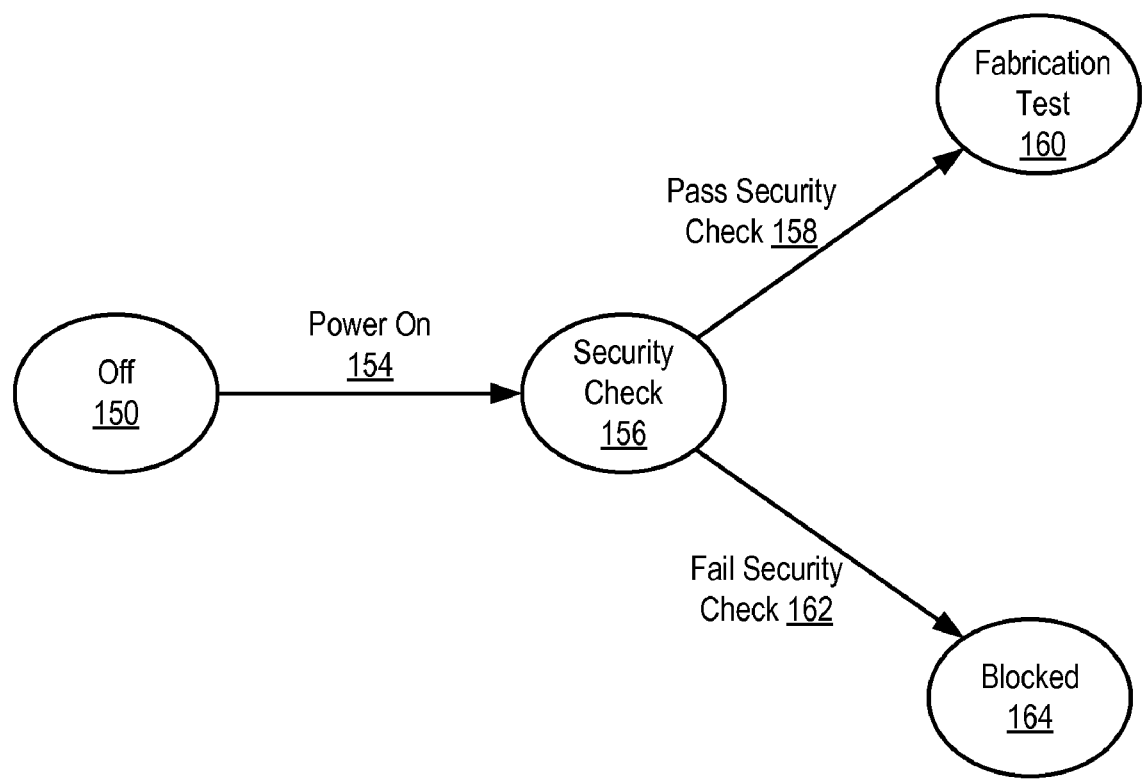
FIG. 4 sets forth a line drawing that illustrates four example security states of an integrated circuit, useful at the fabrication test stage of an integrated circuit life cycle, for securing an integrated circuit according to embodiments of the present invention.

The integrated circuit of FIG. 3 also includes security circuitry (138) that implements a state machine (140) that operates as illustrated in FIG. 4. FIG. 4 sets forth a line drawing that illustrates four example security states of an integrated circuit, useful at the fabrication test stage of an integrated circuit life cycle, for securing an integrated circuit according to embodiments of the present invention. The integrated circuit comes from fabrication, initially having never had power applied to it, in an Off state (150). When the integrated circuit first has power applied (154), the integrated circuit's first security state is a security check state (156). In security check state, security circuitry of the integrated circuit reads a sensed state of a surrogate efuse from a sensing circuit, reads non-volatile data representing the blown state of the surrogate efuse, and determines whether the sensed state of the surrogate efuse is equal to the blown state of the surrogate efuse.

The surrogate efuse in this example emulates only one state of an efuse, that is, the programmed or 'blown' state. The non-volatile data representing the blown state of the surrogate efuse represents only one state of the surrogate efuse, the programmed or 'blown' state. If the sensed state of the surrogate efuse is not equal to the blown state of the surrogate efuse, the integrated circuit appears to be under attack, and the state machine determines that the integrated circuit fails the security check (162) and transitions to a blocked security state (164) in which the integrated circuit ceases to function, stopping its power up or boot processing, blocking all scan access, and locking down all operational logic on the integrated circuit. If the sensed state of the surrogate efuse is equal to the blown state of the surrogate efuse, the integrated circuit apparently is not under attack, and the state machine determines that the integrated circuit passes the security check (158) and transitions to a fabrication test security state (160) in which all operational logic of the integrated circuit is functional and full scan access is granted.

The example of FIG. 4 illustrates four security states. In fact, integrated circuits secured according to embodiments of the present invention may have any number of security states, typically corresponding to stages in integrated circuit life cycle. The security states illustrated in FIG. 4 are appropriate to the fabrication stage of integrated circuit life cycle. Other security state may include for example an original equipment manufacturer ('OEM') security state, a normal operations security state, and a maintenance test security state. During the life cycle of an integrated circuit, unblown efuses may be blown to configure and control access to scan circuitry and operational logic. When an integrated circuit is shipped from its fabricator to an OEM for installation in electronic products, for example, the fabricator may program efuses to exclude access to operational logic and scan circuitry considered confidential or proprietary to the fabricator, leaving sufficient access so that the OEM can configure the integrated circuit in a way appropriate to its use in various products. Similarly, the OEM may program additional efuses to exclude all scan access during normal operation of the integrated circuit in a manufactured product in the hands of an end user—because ordinary users would typically have no need for internal access to operational logic or scan circuitry—and any attempt for such access during the normal operation life cycle stage may be viewed as a potential attack on the integrated circuit. If the integrated circuit fails or is damaged and returned to the OEM or fabricator for analysis or repair, the OEM or fabricator may program additional efuses to return all or part of the scan access for further test of the integrated circuit.

Figure 5:
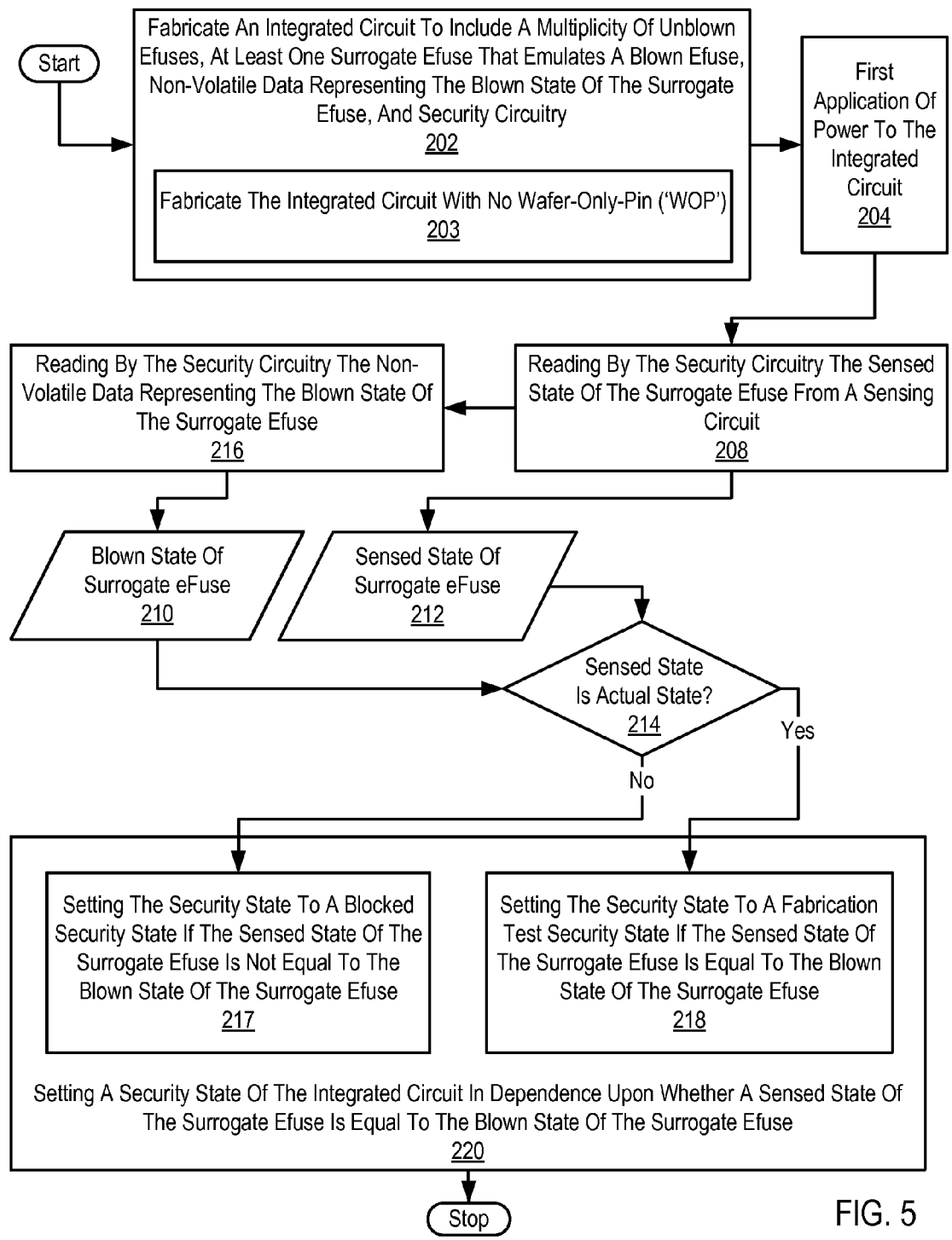
FIG. 5 sets forth a flow chart illustrating an exemplary method for securing an integrated circuit according to embodiments of the present invention.

For further explanation, FIG. 5 sets forth a flow chart illustrating an exemplary method for securing an integrated circuit according to embodiments of the present invention that includes fabricating (202) the integrated circuit to include a multiplicity of unblown efuses, at least one surrogate efuse that emulates a blown efuse, non-volatile data representing the blown state of the surrogate efuse, and security circuitry. In the method of FIG. 5, fabricating (202) the integrated circuit includes fabricating (203) the integrated circuit with no wafer-only pin ('WOP') to enable blowing efuses after fabrication of the integrated circuit.

The method of FIG. 5 includes carrying out the following several steps when power is first applied (204) to the integrated circuit. The method of FIG. 5 includes reading (208) by the security circuitry the sensed state of the surrogate efuse from a sensing circuit when power is first applied. The method of FIG. 5 includes reading (216) by the security circuitry the non-volatile data (210) representing the blown state of the surrogate efuse when power is first applied. The method of FIG. 5 also includes determining (214) by the security circuitry whether a sensed (212) state of the surrogate effuse is equal to the blown state (210) of the surrogate efuse.

The method of FIG. 5 also includes setting (220), by the security circuitry when power is first applied to the integrated circuit, a security state of the integrated circuit in dependence upon whether the sensed state of the surrogate efuse is equal to the blown state of the surrogate efuse. In the method of FIG. 5, setting (220) a security state of the integrated circuit in dependence upon whether a sensed state of the surrogate efuse is equal to the blown state of the surrogate efuse includes setting (218) the security state to a fabrication test security state if the sensed state of the surrogate efuse is equal to the blown state of the surrogate efuse. The fabrication test security state assumes that the integrated circuit is not under attack and grants full access to the operational logic and scan circuitry of the integrated circuit.

In the method of FIG. 5, setting (220) a security state of the integrated circuit in dependence upon whether a sensed state of the surrogate efuse is equal to the blown state of the surrogate efuse also includes setting (217) the security state to a blocked security state if the sensed state of the surrogate efuse is not equal to the blown state of the surrogate efuse. The blocked security state assumes the integrated circuit is under attack, ceases power up operations, locks down operational logic of the integrated circuit, and blocks all scan access.

In view of these explanations, readers will recognize that securing an integrated circuit according to embodiments of the present invention provides the following benefits:

This disclosure details the use of surrogate efuses, which are implemented with similar circuitry as a regular efuse, but which replace the actual efuse element with a resistor to model a blown efuse. A surrogate efuses acts like a blown efuse directly out of fabrication.

In fabrication testing, the status of surrogate efuses may be sensed and read even before any real efuses are blown.

Surrogate efuses may be used to distinguish between secure and non-secure modes, because attacks that attempt to force real efuses to sense in an unblown state would also cause the surrogate efuses to sense as unblown and thus block access to the integrated circuit.

There is no need for a WOP and therefore no special test sequence is needed to drive the WOP to blow the always-blown efuses. Good integrated circuits will work immediately out of fabrication without any special sequencing.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method for securing an integrated circuit, the method comprising:

fabricating the integrated circuit to include a multiplicity of unblown efuses, at least one surrogate efuse that emulates a blown efuse, non-volatile data representing the blown state of the surrogate efuse, and security circuitry; and setting, by the security circuitry when power is first applied to the integrated circuit, a security state of the integrated circuit in dependence upon whether a sensed state of the surrogate efuse is equal to the blown state of the surrogate efuse.

2. The method of claim 1 wherein setting a security state of the integrated circuit is carried out by a state machine of the security circuitry.

3. The method of claim 1 further comprising carrying out the following steps when power is first applied to the integrated circuit:
   reading by the security circuitry the sensed state of the surrogate efuse from a sensing circuit;
   reading by the security circuitry the non-volatile data representing the blown state of the surrogate efuse; and
   determining by the security circuitry whether a sensed state of the surrogate efuse is equal to the blown state of the surrogate efuse.

4. The method of claim 1 wherein setting a security state of the integrated circuit in dependence upon whether a sensed state of the surrogate efuse is equal to the blown state of the surrogate efuse further comprises:
   setting the security state to a fabrication test security state if the sensed state of the surrogate efuse is equal to the blown state of the surrogate efuse; and
   setting the security state to a blocked security state if the sensed state of the surrogate efuse is not equal to the blown state of the surrogate efuse.

5. The method of claim 1 wherein the integrated circuit is characterized by a multiplicity of security states, including a fabrication test security state, an original equipment manufacturer ('OEM') security state, a normal operations security state, a maintenance test security state, and a blocked security state.

6. The method of claim 1 wherein fabricating the integrated circuit further comprises fabricating the integrated circuit with no wafer-only pin ('WOP') to enable blowing efuses after fabrication of the integrated circuit.

7. The method of claim 1 wherein the surrogate efuse comprises a resistor of the integrated circuit having a resistance that emulates a blown efuse.

8. Apparatus for securing an integrated circuit, the apparatus comprising:
   an integrated circuit fabricated to include a multiplicity of unblown efuses, at least one surrogate efuse that emulates a blown efuse, non-volatile data representing the blown state of the surrogate efuse, and security circuitry; and
   security circuitry capable of setting, when power is first applied to the integrated circuit, a security state of the integrated circuit in dependence upon whether a sensed state of the surrogate efuse is equal to the blown state of the surrogate efuse.

9. The apparatus of claim 8 security circuitry capable of setting a security state of the integrated circuit implements a state machine for:
   reading the sensed state of the surrogate efuse from a sensing circuit;
   reading the non-volatile data representing the blown state of the surrogate efuse;
   determining whether a sensed state of the surrogate efuse is equal to the blown state of the surrogate efuse; and
   setting a security state of the integrated circuit in dependence upon whether a sensed state of the surrogate efuse is equal to the blown state of the surrogate efuse.

10. The apparatus of claim 8 further comprising security circuitry capable of carrying out the following steps when power is first applied to the integrated circuit:
    reading the sensed state of the surrogate efuse from a sensing circuit;
    reading the non-volatile data representing the blown state of the surrogate efuse; and
    determining whether a sensed state of the surrogate efuse is equal to the blown state of the surrogate efuse.

11. The apparatus of claim 8 wherein setting a security state of the integrated circuit in dependence upon whether a sensed state of the surrogate efuse is equal to the blown state of the surrogate efuse further comprises:
    setting the security state to a fabrication test security state if the sensed state of the surrogate efuse is equal to the blown state of the surrogate efuse; and
    setting the security state to a blocked security state if the sensed state of the surrogate efuse is not equal to the blown state of the surrogate efuse.

12. The apparatus of claim 8 wherein the integrated circuit is characterized by a multiplicity of security states, including a fabrication test security state, an original equipment manufacturer ('OEM') security state, a normal operations security state, a maintenance test security state, and a blocked security state.

13. The apparatus of claim 8 wherein the integrated circuit is further fabricated with no wafer-only pin ('WOP') to enable blowing efuses after fabrication of the integrated circuit.

14. The apparatus of claim 8 wherein the surrogate efuse comprises a resistor of the integrated circuit having a resistance that emulates a blown efuse.

* * * * *